(12) United States Patent
Li et al.

(10) Patent No.: US 9,799,511 B2
(45) Date of Patent: Oct. 24, 2017

(54) METHODS FOR DEPOSITING LOW K AND LOW WET ETCH RATE DIELECTRIC THIN FILMS

(71) Applicant: Applied Materials, Inc., Santa Clara, CA (US)

(72) Inventors: Ning Li, San Jose, CA (US); Mark Saly, Santa Clara, CA (US); David Thompson, San Jose, CA (US); Mihaela Balseanu, Sunnyvale, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/142,514

(22) Filed: Apr. 29, 2016

(65) Prior Publication Data

US 2016/0322214 A1    Nov. 3, 2016

Related U.S. Application Data

(60) Provisional application No. 62/156,257, filed on May 2, 2015.

(51) Int. Cl.
*H01L 21/311* (2006.01)
*H01L 21/02* (2006.01)
*C23C 16/455* (2006.01)

(52) U.S. Cl.
CPC .... *H01L 21/0228* (2013.01); *H01L 21/02126* (2013.01); *H01L 21/02167* (2013.01); *H01L 21/02211* (2013.01); *H01L 21/02274* (2013.01); *C23C 16/45553* (2013.01); *H01L 21/31111* (2013.01)

(58) Field of Classification Search
None
See application file for complete search history.

(56) References Cited

U.S. PATENT DOCUMENTS

| | | |
|---|---|---|
| 6,410,462 B1 | 6/2002 | Yang et al. |
| 7,135,207 B2 | 11/2006 | Min et al. |
| 7,727,864 B2 | 6/2010 | Elers |
| 8,080,282 B2 | 12/2011 | Fukazawa et al. |
| 8,728,955 B2 | 5/2014 | Lavoie et al. |
| 8,728,956 B2 | 5/2014 | Lavoie et al. |
| 9,076,646 B2 | 7/2015 | Sims et al. |
| 2004/0058293 A1 | 3/2004 | Nguyen et al. |
| 2006/0014399 A1 | 1/2006 | Joe |
| 2006/0228903 A1 | 10/2006 | McSwiney et al. |
| 2006/0269692 A1 | 11/2006 | Balseanu et al. |
| 2006/0286775 A1 | 12/2006 | Singh et al. |
| 2008/0102613 A1 | 5/2008 | Elers |
| 2009/0291232 A1 | 11/2009 | Washio et al. |
| 2010/0081293 A1 | 4/2010 | Mallick et al. |
| 2010/0120233 A1* | 5/2010 | He .................. C23C 16/45519 438/478 |
| 2010/0193955 A1 | 8/2010 | Milligan et al. |
| 2012/0021127 A1* | 1/2012 | Sato ..................... C07F 7/025 427/248.1 |
| 2012/0309205 A1 | 12/2012 | Wang et al. |
| 2013/0084714 A1 | 4/2013 | Oka et al. |
| 2013/0164946 A1 | 6/2013 | Suzuki et al. |
| 2013/0302999 A1* | 11/2013 | Won .................... H01L 21/0262 438/787 |
| 2014/0030448 A1 | 1/2014 | Bowen et al. |
| 2014/0356549 A1 | 12/2014 | Varadarajan |
| 2015/0118865 A1* | 4/2015 | Shimizu ............. H01L 21/0214 438/786 |
| 2015/0147824 A1 | 5/2015 | Cameron et al. |

OTHER PUBLICATIONS

International Search Report and Written Opinion in PCT/US2016/030095 mailed Jul. 29, 2016, 12 pages.

\* cited by examiner

*Primary Examiner* — Calvin Choi
(74) *Attorney, Agent, or Firm* — Servilla Whitney LLC

(57) ABSTRACT

Methods for the formation of SiCN, SiCO and SiCON films comprising cyclical exposure of a substrate surface to a silicon-containing gas, a carbon-containing gas and a plasma. Some embodiments further comprise the addition of an oxidizing agent prior to at least the plasma exposure.

20 Claims, 4 Drawing Sheets

METHODS FOR DEPOSITING LOW K AND LOW WET ETCH RATE DIELECTRIC THIN FILMS

CROSS-REFERENCE TO RELATED APPLICATIONS

This application claims priority to U.S. Provisional Application No. 62/156,257, filed May 2, 2015, the entire disclosure of which is hereby incorporated by reference herein.

TECHNICAL FIELD

The present disclosure relates generally to methods of depositing thin films. In particular, the disclosure relates to atomic layer deposition processes for the deposition of films comprising SiCN, SiCO and/or SiCON.

BACKGROUND

Silicon nitride films may play an important role in the manufacture of transistors, as a nitride spacer, or in memory, as the floating gate. In order to deposit these films with good step coverage over nanoscale, high-aspect ratio structures, a film deposition called Atomic Layer Deposition (ALD) is needed. ALD is the deposition of a film by sequentially pulsing two or more precursors separated by an inert purge. This allows the film growth to proceed layer by layer and is limited by the surface active sites. Film growth in this manner allows for thickness control over complex structures, including re-entrance features.

Dielectric thin films with low dielectric constants (low k) and low wet etch rate (in diluted HF solution) properties, such as SiCN or SiCON, can be used as spacer materials in front end processes in the semiconductor industry. Most thin film properties cannot meet practical requirements due to poor film composition control, such as hydrogen contamination and/or different bonding states of carbon in the film. Poor conformality of the film deposited on 3D trenches is also known. Accordingly, there is a need in the art for low k and low wet etch rate SiCN, SiCO and SiCON films.

SUMMARY

One or more embodiments of the disclosure are directed to processing methods. At least a portion of a substrate surface is exposed to a silicon-containing precursor to form a first silicon-containing film. The first silicon-containing film is exposed to a carbon-containing precursor to form a second silicon-containing film. The second silicon-containing film comprises carbon. The second silicon-containing film is exposed to a plasma to form a silicon-carbon film.

Additional embodiments of the disclosure are directed to processing methods comprising exposing a substrate surface to at least two deposition cycles. Each deposition cycle comprises exposing at least a portion of the substrate surface to a silicon-containing precursor to form a first silicon-containing film. The silicon-containing film is exposed to a carbon-containing precursor consisting essentially of carbon and nitrogen atoms to form a second silicon-containing film. The second silicon-containing film is exposed to a plasma to form a silicon carbonitride film.

Further embodiments of the disclosure are directed to processing methods comprising placing a substrate having a substrate surface into a processing chamber. The processing chamber comprises a plurality of sections, where each section is separated from adjacent sections by a gas curtain. At least a portion of the substrate surface is exposed to a first process condition in a first section of the processing chamber. The first process condition comprises a silicon-containing precursor to form a first silicon-containing film. The substrate surface is laterally moved through a gas curtain to a second section of the processing chamber. The first silicon-containing film is exposed to a carbon-containing precursor to form a second silicon-containing film. The carbon-containing precursor consists essentially of carbon and nitrogen atoms to form a second silicon-containing film. The substrate surface with the second silicon-containing film is laterally moved through at least one gas curtain to a third section or fourth section of the processing chamber. The second silicon-containing film is exposed to a plasma comprising an inert gas and, optionally, one or more of hydrogen, nitrogen and oxygen containing species to form a silicon carbonitride or silicon oxycarbonitride film. The substrate surface is laterally moved from the third section or fourth section of the processing chamber through a gas curtain. The exposure to the first section, second section and third section or fourth section including lateral movement of the substrate surface is repeated to form a silicon carbonitride or silicon oxycarbonitride film of a predetermined thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
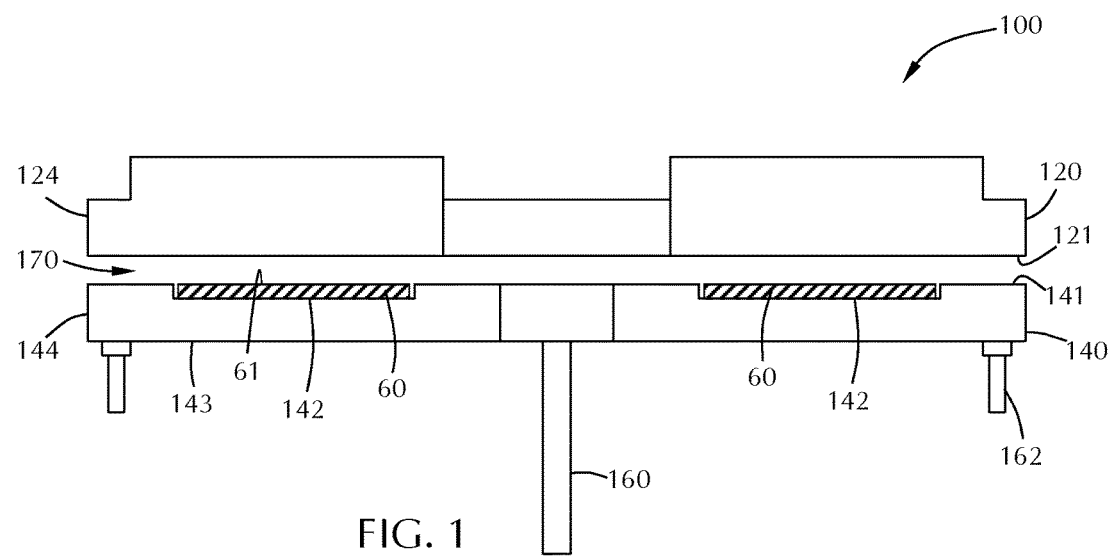
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

The inventors have surprisingly found that a spatial atomic layer deposition process can form low k and low wet etch rate (WER) SiCN, SiCO and SiCON films. As used in this specification and the appended claims, use of the term SiCN only means that the film has silicon, carbon and nitrogen atoms and does not imply stoichiometric amounts. The use of SiCO and SiCON also refer to the atomic components, not a stoichiometric amount. The films may have other atoms present unless otherwise indicated. Typically, the other atoms present are not found in a quantity that would affect the film properties. Use of the term "consisting essentially of", when describing a precursor or film composition refers only to the atomic percentage of silicon, carbon, oxygen and nitrogen atoms. For example, a precursor consisting essentially of carbon and nitrogen atoms means that there are substantially no oxygen atoms. The precursor may have other elements, like hydrogen. The use of "substantially no oxygen atoms", and the like, mean that oxygen atoms are not present in an amount greater than about 2 atomic %, 1 atomic %, 0.5 atomic % or 0.1 atomic %.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

One or more embodiments of the disclosure are directed to processing methods comprising sequentially exposing a substrate surface to a silicon-containing precursor and a carbon-containing precursor and a plasma. The sequential exposure of the silicon-containing precursor, the carbon-containing precursor and the plasma forms a silicon-carbon film. As used in this regard, a "silicon-carbon film" refers to a film comprising silicon and carbon atoms, but is not limited to only silicon and carbon. In some embodiments, at least a portion of a substrate surface is exposed to a silicon-containing precursor to form a first silicon-containing film. The first silicon-containing film is then exposed to a carbon-containing precursor to form a second silicon-containing film which comprises silicon and carbon. Without being bound by any particular theory of operation, it is believed that the film has unwanted terminations, such as chloride terminated or OH terminated components. The subsequent exposure to the plasma causes the film to cross-link and remove most, if not all, of these unwanted terminations.

The silicon-containing precursor can include any suitable silicon precursor that can react with the substrate surface. The silicon-containing precursor can be halogenated or non-halogenated. A halogenated precursor means that at least one halogen atom is bound to a silicon atom. Suitable silicon halide include, but are not limited to, $SiCl_4$, monochlorosilane, dichlorosilane, trichlorosilane, silane, disilane, organosilicates, aminosilanes and organosilanes. In some embodiments, the silicon-containing precursor consists essentially of silicon halide. As used in this regard, "consists essentially of silicon halide" means that the gas flow contains substantially only silicon halide as a surface active component. Other non-reactive gases, for example, carrier gases, can be included.

The carbon-containing precursor can include any suitable carbon-containing species that can react with the substrate surface, or the silicon-containing film on the surface. Suitable examples include, but are not limited to, carbon tetrachloride, carbon dioxide, alkanes, ethylene diamine and acetylene. In some embodiments, the carbon-containing precursor comprises a compound having carbon and nitrogen atoms, for example, ethylene diamine.

In one or more embodiments, the carbon-containing precursor consists essentially of carbon and nitrogen atoms, meaning that there is substantially no oxygen atoms present in the precursor. In some embodiments, the carbon-containing precursor consists essentially of ethylene diamine. For example, such a precursor might be useful for the deposition of a SiCN film. In some embodiments, the carbon-containing precursor comprises one or more of an alkylamine, diamine, polyamine and/or a cyclic amine. The amines can be primary, secondary, tertiary or heterocyclic.

In one or more embodiments, the carbon-containing precursor comprises a compound having carbon and oxygen atoms. For example, such a precursor might be useful for the deposition of SiCO films. In some embodiments, the carbon-containing precursor comprises substantially no carbon atoms or the precursor consists essentially of carbon and oxygen atoms, meaning that there are substantially no nitrogen atoms. For example, the carbon-containing precursor can include one or more of $CO_2$, an alcohol and/or an ether.

In some embodiments, the carbon-containing precursor comprises carbon, oxygen and nitrogen atoms. For example, such a precursor might be useful in the deposition of SiCON films. In one or more embodiments, the carbon-containing precursor comprises one or more of an alkylamino-alcohol or a mixture of compounds having carbon and nitrogen atoms and/or carbon and oxygen atoms.

The plasma can be any suitable plasma species. In some embodiments, the plasma comprises at least one inert species. For example, an argon plasma. In some embodiments, the plasma further comprises a species that reacts with the film, such as hydrogen or oxygen. In some embodiments, the plasma comprises at least one inert species and an oxygen species and the silicon-carbon film further comprises oxygen. In one or more embodiments, the plasma comprises at least one inert species and a nitrogen-containing precursor and the silicon-carbon film further comprises nitrogen.

In some embodiments, the plasma comprises one or more of helium, neon, argon or krypton. In one or more embodiments, the plasma further comprises one or more of hydrogen, ammonia and/or nitrogen. For example, the plasma may comprise an argon/nitrogen, argon/hydrogen and/or argon/nitrogen/ammonia mixture. The inventors have surprisingly found that the composition of the plasma, e.g., the species and relative concentrations, can impact the film properties.

The power of the plasma also has a surprising effect on the film properties. Any suitable plasma frequency or power can be used. In some embodiments, the plasma power is in the range of about 25 watts to about 300 watts, or in the range of about 50 watts to about 200 watts, or about 200 watts, about 100 watts, or about 50 watts.

In some embodiments, the first silicon-containing film and/or the second silicon-containing film is exposed to an oxygen source prior to exposure to the plasma. For example, after exposing the first silicon-containing film to ethylene diamine, the film can be exposed to water vapor to incorporate oxygen into the film. This can be done during the plasma or prior to plasma exposure. Suitable oxygen sources include but are not limited to oxygen, carbon dioxide, water and ozone.

The processing method can be performed at any suitable temperature. In some embodiments, all of the processing portions are, independently, within the range of about 200° C. and about 650° C. It has been found that the silicon-carbon films can be deposited at lower temperature than expected. In some embodiments, all of the processing conditions are independently, less than or equal to about 500° C., 450° C., 400° C. or 350° C.

The silicon-carbon film formed has properties that make films with low wet etch rates, low dielectric constants, and high thermal stability and/or form films with good conformality. In some embodiments, a silicon carbonitride film is formed and has a wet etch rate ratio (WERR) in dilute HF of less than about 0.5, or about 0.4, or about 0.3, or about 0.2, or about 0.1, or about 0.05. The wet etch rate ratio is measured relative to a thermal silicon oxide film using dilute HF (e.g., 1:100 HF).

The silicon-carbon films formed had excellent growth rates. In some embodiments, the silicon nitride film has a growth rate greater than or equal to about 0.2 Å/cycle, or greater than or equal to about 0.25 Å/cycle, or greater than or equal to about 0.3 Å/cycle, or greater than or equal to about 0.35 Å/cycle, or greater than or equal to about 0.4 Å/cycle, or greater than or equal to about 0.45 Å/cycle.

Some embodiments of the disclosure are directed to silicon nitride film deposition using a batch processing chamber, also referred to as a spatial ALD chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
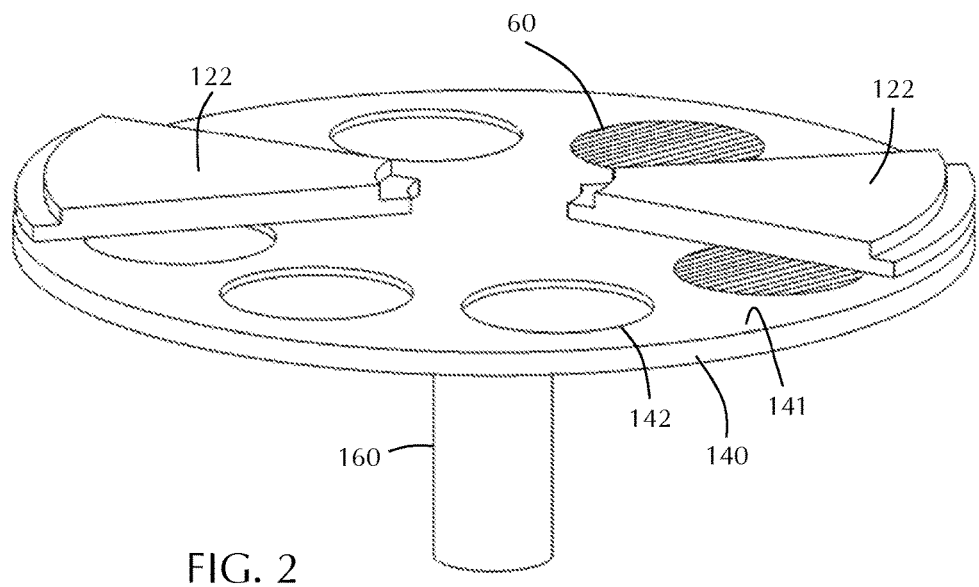
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
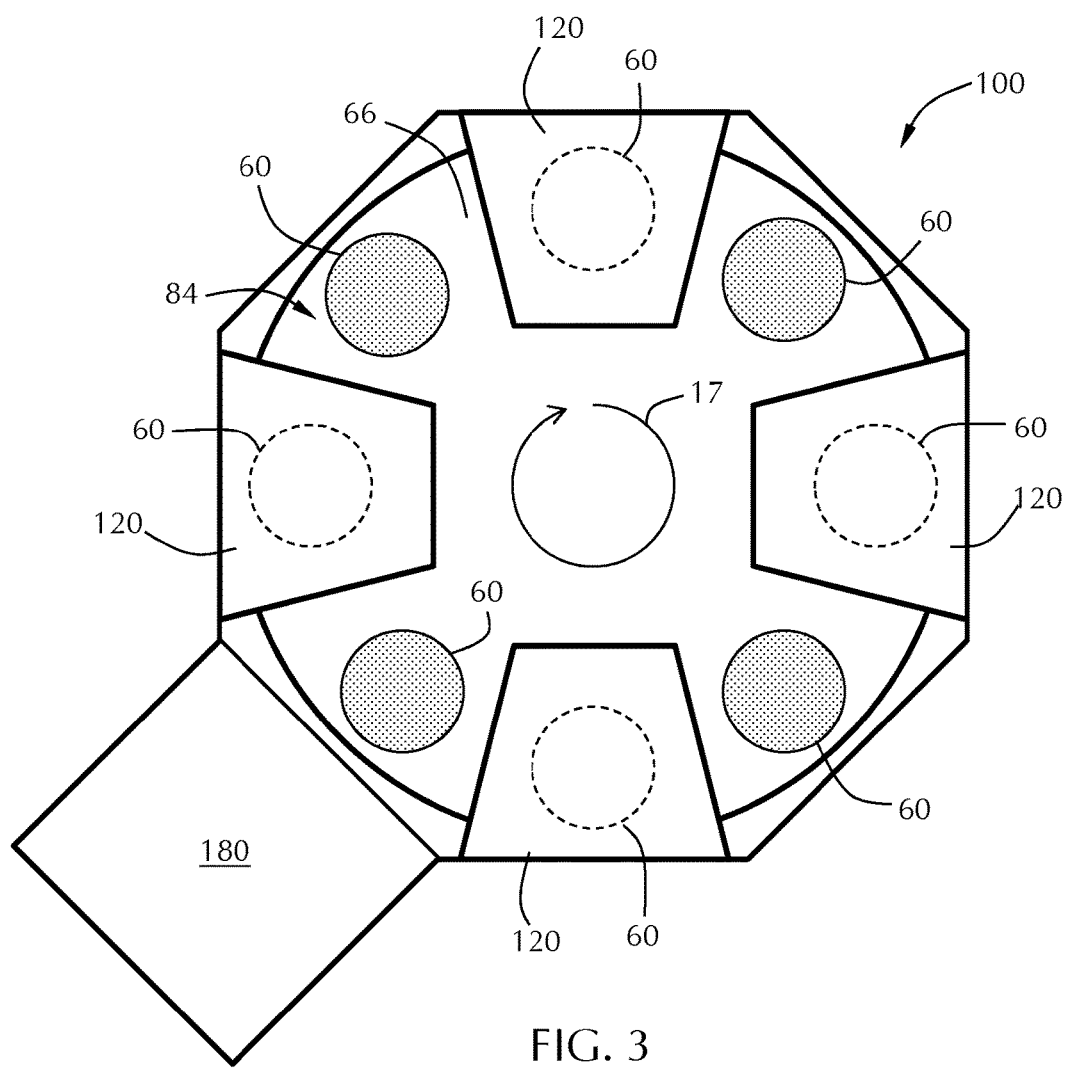
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the injector assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
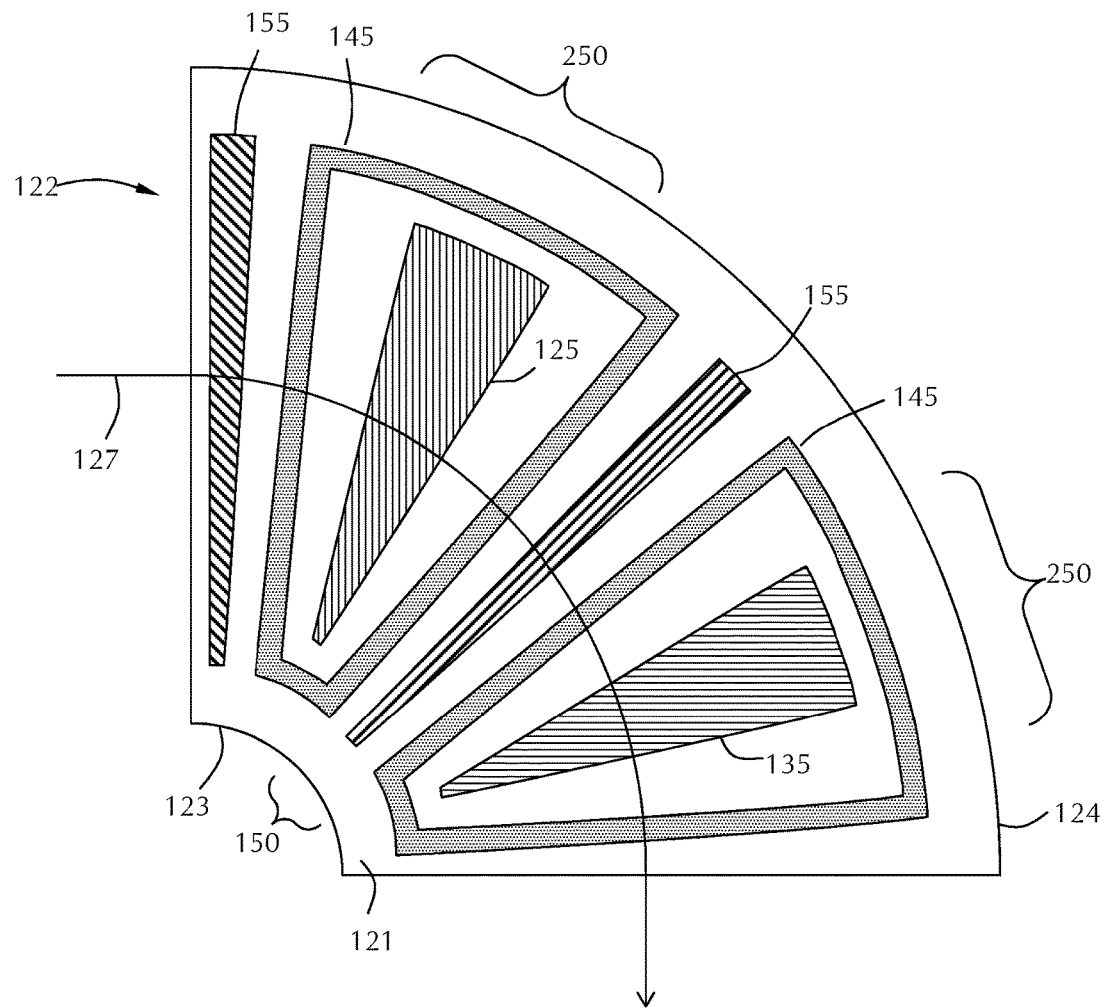
FIG. 4 shows a schematic view of a portion of a wedge shaped gas distribution assembly for use in a batch processing chamber in accordance with one or more embodiment of the disclosure.
Figure 5:
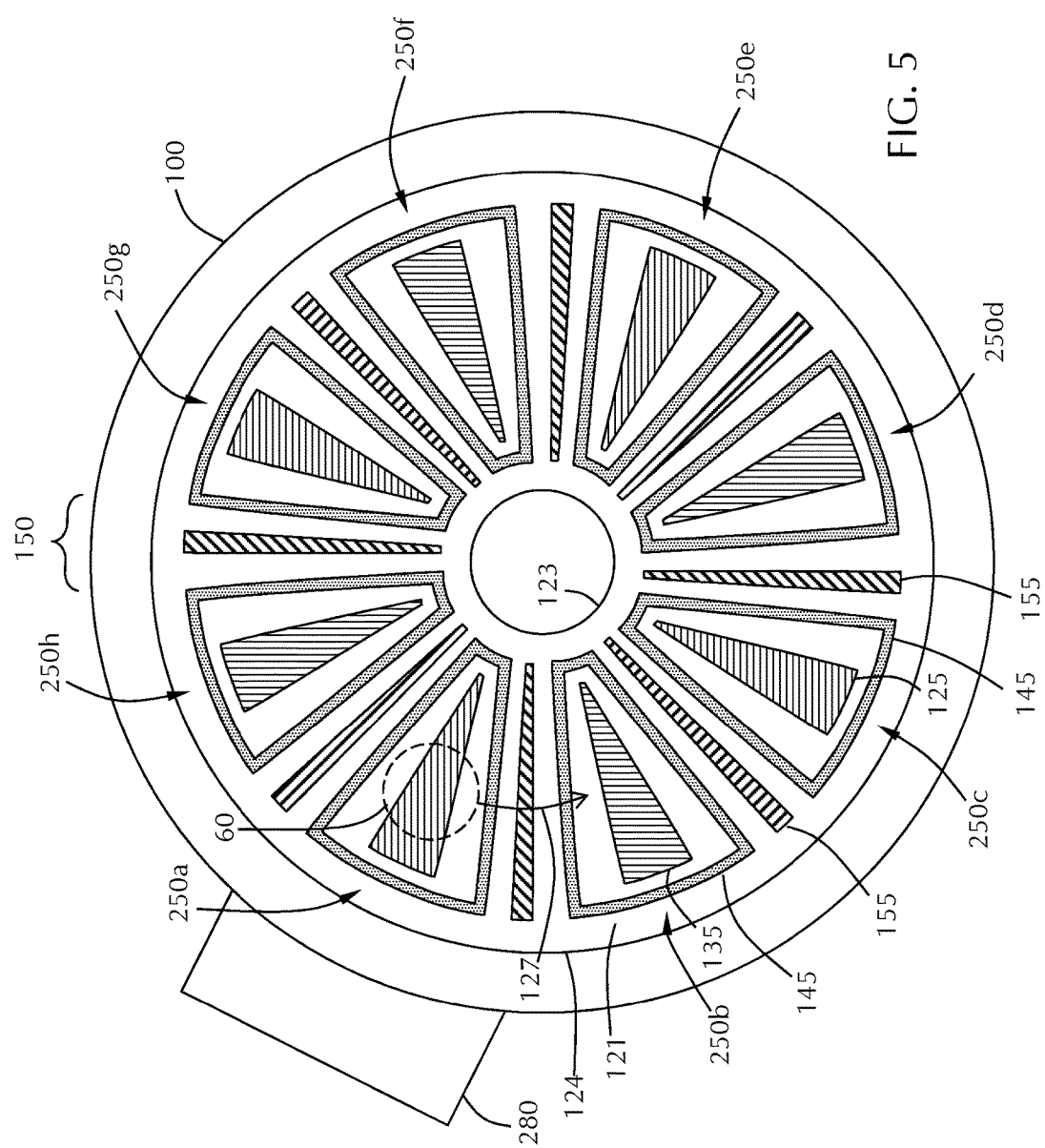
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time required to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of processing regions 250, each section separated from adjacent section by a gas curtain 150. At least a portion of the substrate surface is exposed to a first process condition in a first section 250a of the processing chamber. For example, the first process condition comprises the silicon-containing precursor and an optional carrier gas. In the first section 250a, the first silicon-containing film can be formed.

The substrate surface is laterally moved through a gas curtain 150 to a second section 250b. Here, the first silicon-containing film is exposed to a second process condition comprising a carbon-containing precursor to form the second silicon-containing film.

The substrate surface is laterally moved with the second silicon-containing film through a gas curtain 150 to a third section 250c of the processing chamber. The third section can be either the plasma exposure or a purge gas region. In the embodiment shown in FIG. 5, there are eight sections. If there are three process conditions, then a purge section might be used to geometrically balance the deposition so that a complete cycle through the processing chamber results in the formation of two layers. Accordingly, the substrate having the second silicon-containing film is moved through a gas curtain 150 to either the third section 250c or the fourth section 250d. In the third section 250c or fourth section 250d, the second silicon-containing film is exposed to plasma to form the silicon-carbon film.

In an embodiment including oxygen exposure, the third section 250c might include the oxygen source gas. For example, the second silicon-containing film can be exposed to an oxidizing gas in the third section 250c before moving into the fourth section 250d.

The substrate surface can then be laterally moved from the fourth section 250d through a gas curtain 150 into another region of the processing chamber. In the other regions of the processing chamber, the substrate surface can be, for example, repeatedly exposed to additional first, second, third and/or fourth process conditions to form a film with a predetermined film thickness.

EXAMPLES

Several SiCN films were formed using different plasma gases. Each of the films was formed at about 550° C. with a pressure of about 6.5 Torr and a rotation speed of about 6 rpm. Dichlorosilane was flowed into the first sections at a flow rate of about 400 sccm. Ethylene diamine was flowed into the second sections at a flow rate of about 250 sccm. The plasma formed in the fourth sections was varied as shown in Table 1. The third section had a purge gas flow.

TABLE 1

|  | Example A | Example B | Example C | Example D |
|---|---|---|---|---|
| Plasma composition | Ar | $Ar/N_2$ | $Ar/N_2/NH_3$ | $Ar/H_2$ |
| GPC (Å/cycle) | 0.458 | 0.504 | 0.495 | 0.271 |
| Refractive index | 1.996 | 1.956 | 1.952 | 2.01 |
| WERR | 0.12 | 0.20 | 0.22 | 0.02 |

Several SiCN films were formed using different plasma powers. Each of the films was formed at about 550° C. with a pressure of about 6.5 Torr and a rotation speed of about 6 rpm. Dichlorosilane was flowed into the first sections at a flow rate of about 400 sccm. Ethylene diamine was flowed into the second sections at a flow rate of about 250 sccm. The plasma formed in the fourth section was $Ar/H_2$ mixture (1200/300) and the power was varied as shown in Table 2. The third section had a purge gas flow.

TABLE 2

|  | Example E | Example F | Example G |
|---|---|---|---|
| Plasma Power | 200 W | 100 W | 50 W |
| GPC (Å/cycle) | 0.271 | 0.233 | 0.210 |

TABLE 2-continued

|  | Example E | Example F | Example G |
|---|---|---|---|
| Refractive index | 2.01 | 1.99 | 1.98 |
| Dielectric constant | 5.8 | 5.0 | 4.4 |
| WERR | .02 | .02 | .02 |

Accordingly, some embodiments of the disclosure are directed to SiCN films having a refractive index greater than or equal to about 1.950, 1.960, 1.970, 1.980, 1.990 or 2.000 and/or a wet etch rate ratio less than about 0.25, 0.20, 0.15, 0.10, 0.05 or 0.03. In some embodiments, the SiCN film has a dielectric constant less than or equal to about 5.8, 5.6, 5.4, 5.2, 5.0, 4.8, 4.6, 4.5 or 4.4.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure.

Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all excess reagents out of the chamber before flowing in additional regent. Therefore, any leftover reagent in the chamber may react. With spatial separation, excess reagent does not need to be purged, and cross-contamination is limited. Furthermore, a lot of time can be required to purge a processing chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   exposing at least a portion of a substrate surface to a silicon-containing precursor to form a first silicon-containing film;
   exposing the first silicon-containing film to a carbon-containing precursor to form a second silicon-containing film, the second silicon-containing film comprising carbon; and
   exposing the second silicon-containing film to a plasma to form a silicon-carbon film.

2. The processing method of claim 1, wherein the silicon-containing precursor comprises silicon halide.

3. The processing method of claim 2, wherein the silicon-containing precursor consists essentially of silicon halide.

4. The processing method of claim 1, wherein the carbon-containing precursor comprises a compound having carbon and nitrogen atoms.

5. The processing method of claim 4, wherein the carbon-containing precursor comprises substantially no oxygen atoms.

6. The processing method of claim 4, wherein the carbon-containing precursor comprises one or more of an alkylamine, diamine, polyamine or a cyclic amine.

7. The processing method of claim 1, wherein the carbon-containing precursor comprises a compound having carbon and oxygen atoms.

8. The processing method of claim 7, wherein the carbon-containing precursor comprises substantially no nitrogen atoms.

9. The processing method of claim 7, wherein the carbon-containing precursor comprises one or more of $CO_2$, an alcohol and/or an ether.

10. The processing method of claim 1, wherein the carbon-containing precursor comprises carbon, oxygen and nitrogen atoms.

11. The processing method of claim 10, wherein the carbon-containing precursor comprises one or more of an alkylamino-alcohol or a mixture of compounds having carbon and nitrogen atoms or carbon and oxygen atoms.

12. The processing method of claim 1, wherein the method is performed at a temperature in the range of about 200° C. to about 650° C.

13. The processing method of claim 1, further comprising exposing the second silicon-containing film to an oxygen source prior to exposure to the plasma to form a silicon-carbon-oxygen film.

14. The processing method of claim 1, wherein the plasma comprises at least one inert species and an oxygen species and the silicon-carbon film further comprises oxygen.

15. The processing method of claim 1, wherein the plasma comprises at least one inert species and a nitrogen-containing precursor and the silicon-carbon film further comprises nitrogen.

16. A processing method comprising exposing a substrate surface to at least two deposition cycles, each deposition cycle comprising:
   exposing at least a portion of the substrate surface to a silicon-containing precursor to form a first silicon-containing film;
   exposing the silicon-containing film to a carbon-containing precursor consisting essentially of carbon and nitrogen atoms to form a second silicon-containing film; and
   exposing the second silicon-containing film to a plasma to form a silicon carbonitride film.

17. The processing method of claim 16, wherein the silicon-containing precursor comprises a silicon halide, and the carbon-containing precursor consists essentially of ethylenediamine.

18. The method of claim 17, wherein the silicon carbonitride film has a wet etch rate ratio in dilute HF relative to a thermal silicon oxide film of less than about 0.5.

19. The method of claim 16, wherein one or more of the carbon-containing precursor or the plasma further comprises an oxygen-containing species.

20. A processing method comprising:
   placing a substrate having a substrate surface into a processing chamber comprising a plurality of sections, each section separated from adjacent sections by a gas curtain;
   exposing at least a portion of the substrate surface to a first process condition in a first section of the processing chamber, the first process condition comprising a silicon-containing precursor to form a first silicon-containing film;
   laterally moving the substrate surface through a gas curtain to a second section of the processing chamber;
   exposing the first silicon-containing film to a carbon-containing precursor to form a second silicon-containing film, the carbon-containing precursor consisting essentially of carbon and nitrogen atoms to form a second silicon-containing film;
   laterally moving the substrate surface with the second silicon-containing film through at least one gas curtain to a third section or fourth section of the processing chamber;
   exposing the second silicon-containing film to a plasma comprising an inert gas and, optionally, one or more of hydrogen, nitrogen and oxygen containing species to form a silicon carbonitride or silicon oxycarbonitride film; and
   laterally moving the substrate surface from the third section or fourth section of the processing chamber through a gas curtain; and
   repeating exposure to the first section, second section and third section or fourth section including lateral movement of the substrate surface to form a silicon carbonitride or silicon oxycarbonitride film of a predetermined thickness.

* * * * *